US009746016B2

(12) United States Patent
Vargha et al.

(10) Patent No.: US 9,746,016 B2
(45) Date of Patent: Aug. 29, 2017

(54) FASTENING DEVICE AND METHOD FOR FASTENING AN ELEMENT IN A KEYHOLE-SHAPED CUTOUT IN A WALL

(75) Inventors: David Vargha, Budapest (HU); Boris Adam, Gaeufelden (DE); Ulf Behnke, Reutlingen (DE); Jeanine Wegner, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 1116 days.

(21) Appl. No.: 13/061,478

(22) PCT Filed: Jul. 9, 2009

(86) PCT No.: PCT/EP2009/058728
§ 371 (c)(1),
(2), (4) Date: May 23, 2011

(87) PCT Pub. No.: WO2010/023020
PCT Pub. Date: Mar. 4, 2010

(65) Prior Publication Data
US 2011/0211931 A1    Sep. 1, 2011

(30) Foreign Application Priority Data

Aug. 27, 2008  (DE) .................. 10 2008 041 613

(51) Int. Cl.
*F16B 39/00*    (2006.01)
*F16B 21/09*    (2006.01)
(Continued)

(52) U.S. Cl.
CPC ........... *F16B 21/09* (2013.01); *H05K 5/0073* (2013.01); *H05K 5/0078* (2013.01); *H05K 5/0204* (2013.01)

(58) Field of Classification Search
CPC  B23P 11/00; F16B 5/02; F16B 37/044; F16B 41/002; H01R 13/447; H01R 13/5213; B60R 21/01
(Continued)

(56) References Cited

U.S. PATENT DOCUMENTS 6,222,123 B1 *  4/2001  Schwarz .................. 174/60
6,281,444 B1 *  8/2001  Yamanashi ............. 174/138 F
(Continued)

FOREIGN PATENT DOCUMENTS

DE   102005002021   *  7/2006
EP   1 532 372        5/2005

OTHER PUBLICATIONS

Pakzadeh, Jul. 2006, DE 10 2005 002 021 A1 Machine Translation.*
International Search Report for PCT/EP2009/058728, dated Jul. 17, 2009.

*Primary Examiner* — Jacob Cigna
*Assistant Examiner* — Lee A Holly
(74) *Attorney, Agent, or Firm* — Norton Rose Fulbright US LLP; Gerard Messina

(57) ABSTRACT

A fastening device for fastening an element in a keyhole-shaped cutout in a wall includes a retaining element which in the fastened state of the fastening device is designed to rest against a front side of the wall, and to at least partially cover an edge of a narrower opening of the key-shaped section in a wall. The fastening device also includes a support element which in the fastened state of the fastening device is designed to engage through a wider opening of the keyhole-shaped cutout in the wall, and to support the fastening device against a lateral edge of the wider opening during fastening.

9 Claims, 4 Drawing Sheets

(51) Int. Cl.
*H05K 5/02* (2006.01)
*H05K 5/00* (2006.01)

(58) Field of Classification Search
USPC ........... 29/525.01, 525.11; 439/93, 113, 135, 439/137–140, 145, 278, 577; 411/103
See application file for complete search history.

(56) References Cited

U.S. PATENT DOCUMENTS 7,277,022 B2 * 10/2007 Christoph ............... B60R 21/01
340/693.5
2006/0024146 A1 * 2/2006 Fink et al. .................... 411/103

* cited by examiner

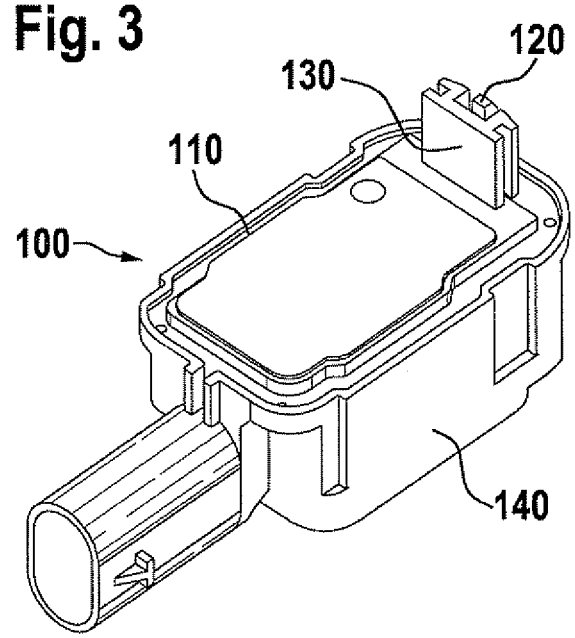
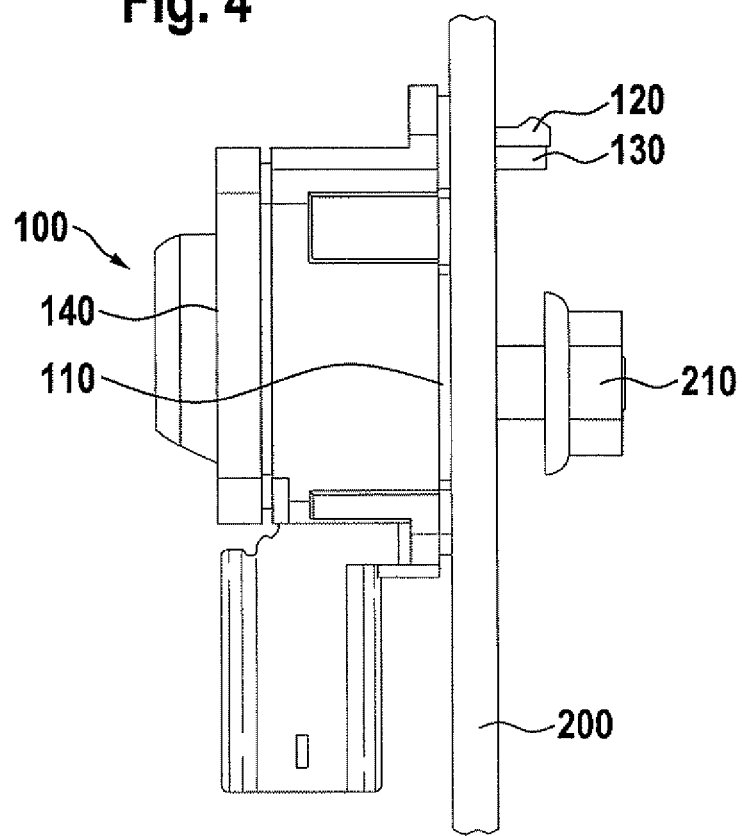

FASTENING DEVICE AND METHOD FOR FASTENING AN ELEMENT IN A KEYHOLE-SHAPED CUTOUT IN A WALL

FIELD OF THE INVENTION

The present invention relates to a fastening device for fastening an element in a keyhole-shaped cutout in a wall and a method for fastening a fastening device to a wall.

BACKGROUND INFORMATION

Components, in particular sensors (for restraint systems, for example), are fastened to the vehicle in various ways in the automotive industry. In addition to screwing to a nut which is welded into the body, or screwing with the aid of a screw through a hole in the body and into a threaded bushing of the component, the "keyhole principle" is used for fastening housings. For example, a bolt which is preinstalled in the housing together with a self-locking nut is inserted into the larger portion of a keyhole-like hole in the body panel of the vehicle, and is then suspended into the lower, narrower portion of the keyhole. The nut is then tightened, thus securely clamping the component.

Compared to the two other methods mentioned above, the keyhole principle has the advantage that a welded-in or preinstalled nut in the vehicle is not required, which represents a significant cost advantage. The keyhole principle also allows so-called "one-hand assembly," and its use is therefore very popular in some cases, for example in assembly areas which are difficult to access.

However, during assembly the component may twist in the keyhole if appropriate anti-twist protection is not provided. The sensor cannot be guaranteed to fulfill its function if it twists during assembly.

A component is described in EP 1 532 372 which has anti-twist protection for assembly in a keyhole-shaped cutout. However, the component must first be inserted into the keyhole and secured therein in order for the anti-twist protection to become effective.

SUMMARY

Example embodiments of the present invention provide a fastening device for fastening an element in a keyhole-shaped cutout in a wall, the fastening device having the following features:
a retaining element which in the fastened state of the fastening device is designed to rest against a front side of the wall and to at least partially cover an edge of a narrower opening of the key-shaped section; and
at least one support element which in the fastened state of the fastening device is designed to engage through a wider opening of the keyhole-shaped cutout in the wall, and to support the fastening device against a lateral edge of the wider opening during fastening.

Moreover, example embodiments of the present invention provide a method for fastening a fastening device to a wall which includes a keyhole-shaped cutout, the fastening device including a retaining element and at least one support element, the keyhole-shaped cutout being formed by a wider opening in the wall and a narrower opening in the wall which is connected to the wider opening, and the method including the following steps:
inserting the support element of the fastening device through the wider opening of the keyhole-shaped cutout in the wall, the retaining element at least partially covering an edge of the narrower opening of the keyhole-shaped cutout;
supporting the fastening device against twisting by pressing the at least one support element against the lateral edge of the wider opening of the keyhole-shaped cutout; and
pressing the retaining element against the wall.

Twisting of the fastening device during fastening may be prevented by inserting the support element into the wider opening of the keyhole-shaped cutout in the wall during insertion of the fastening device, and this support element is laterally supported against an edge of the wider opening during fastening of the fastening device. The fastening device is then no longer able to twist in the region of the narrower opening during fastening with the aid of a screwing device, for example. In addition, the fastening device is no longer able to easily fall out of the keyhole-shaped cutout, since such falling out is at least partially prevented by the support element (which projects from the retaining element), even when fastening is not yet complete. This is achieved by the fact that when the fastening device tips forward, the support element which engages through the wider opening tilts at the upper edge of the wider opening, thus preventing the fastening device from completely falling out of the keyhole-shaped cutout. In order to have the largest possible support surface between the support element and the lateral edge of the larger opening, the support element in particular may have straight side edges, and the keyhole-shaped cutout may also advantageously have straight side edges in the region of the wider opening.

Example embodiments of the present invention provide the advantage that a great improvement in the anti-twist protection is made possible by using an additional element which is simple and inexpensive to implement. In particular by providing the lateral support at the edge of the wider opening of the keyhole-shaped cutout, anti-twist protection may be implemented which has sufficient load resistance to the torsional forces, for example when the fastening device is screwed down.

It is also advantageous when the support element has a straight supporting edge for support on the lateral edge of the wider opening. This prevents the support from being provided only at certain points, in which case high material stress occurs at these points which may possibly result in material wear at this support point between the support element and the side edge of the opening.

In example embodiments of the present invention, at least two support elements are provided which are designed to support the fastening device at oppositely situated edges of the wider opening in the wall. This provides uniform anti-twist protection, and a possible rotational direction during screwing down does not have to be taken into account. The fastening protection to be provided is thus more flexible in use, with only slight design changes in the shape.

Each of the two support elements may also have a supporting edge, the supporting edges being situated at a mutual distance which corresponds to a width of the wider opening of the keyhole-shaped cutout in the wall. This example embodiment of the present invention offers the advantage that the support elements provide good guiding or clamping of the fastening device in the keyhole-shaped cutout, so that the fastening device may substantially be prevented from falling out.

Furthermore, in example embodiments of the present invention the at least one support element may have an angular shape. This increases the stability, thus providing sufficient support of the fastening device at the lateral edge of the wider opening, even for high torsional forces, without concerns for destruction of the support element.

In addition, in example embodiments of the present invention, in the fastened state a partial section of the angular support element may project substantially at a right angle from an edge of the wider opening into an inner region of the wider opening, the partial section being situated at the side of the support element facing away from the narrower opening. This configuration of the partial section which projects at an angle into the inner region of the wider opening offers the advantage that the largest possible supporting force of this partial section of the support element is thus made possible.

Furthermore, the fastening device may include a locking element which in the fastened state of the fastening device is designed to engage through a wider opening of the keyhole-shaped cutout in the wall and to retain the fastening device from a back side of the wall. Such example embodiments of the present invention provide an additional hold to keep the fastening device from falling out of the keyhole-shaped cutout in the wall.

The locking element may also include a hook which is made of a flexible material. This offers the option of using an easily manufactured and reliably functioning snap-on closure for retention.

In example embodiments of the present invention, the locking element may also be at least partially enclosed by a protective element. This example embodiment of the present invention provides increased protection for the locking element against damage.

In addition, according to example embodiments of the present invention a sensor element having a fastening device may be provided, as described above. Such a sensor element offers the advantage that in particular a very secure anti-twist protection may be implemented, so that the sensor element remains precisely aligned during fastening.

Example embodiments of the present invention are explained in greater detail below as an example, with reference to the accompanying figures.

BRIEF DESCRIPTION OF THE DRAWINGS

FIG. 3 shows a perspective illustration of an example embodiment of a fastening device together with a locking element;

FIG. 4 shows a side view of the example embodiment of the fastening device illustrated in FIG. 3;

DETAILED DESCRIPTION

Figure 1:
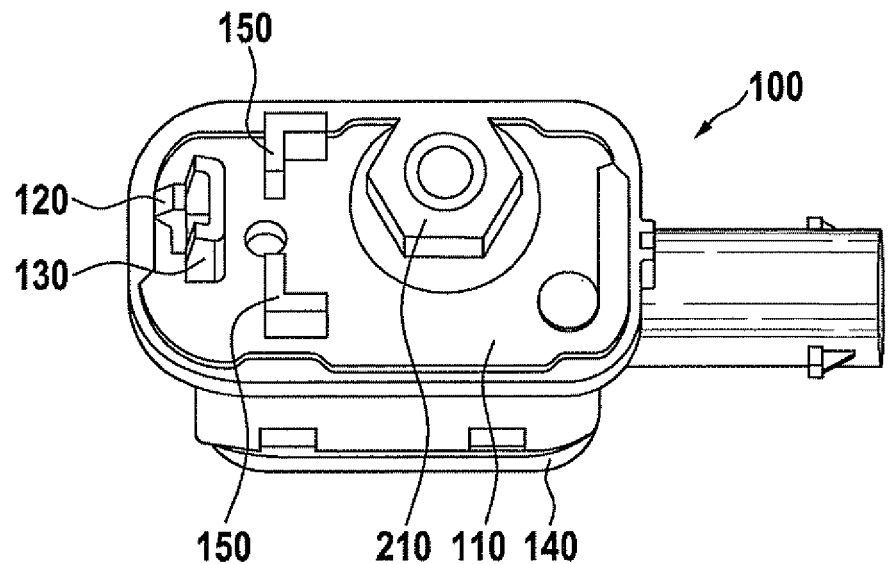
FIG. 1 shows a perspective illustration of an exemplary embodiment of the present invention.

Any indicated dimensions and measurements are for example only, so that the present invention is not limited to these dimensions and measurements. Identical or similar elements are provided with identical or similar reference numerals. In addition, the figures of the drawing, and the description thereof, contain numerous features in combination. It should be understood that these features may also be considered individually, or may be combined into further combinations not explicitly described herein.

The purpose of example embodiments of the present invention, among other things, is to ensure increased anti-twist protection in the assembly of a component, using a keyhole-screw design. A further aim is to provide an option for preventing the component from partially tilting outward after a screw-in bolt is inserted into the keyhole. When this tilting outward occurs, the component may twist about the axis of a fastening bolt so that it may then no longer be correctly screwed on. This risk is eliminated with the aid of example embodiments of the present invention.

FIG. 1 illustrates a perspective view of an exemplary embodiment of the present invention. A fastening element 100 includes a retaining element 110 which is formed by a retaining plate, for example, and which rests against a wall when fastening device 100 is fastened in the keyhole-shaped cutout in the wall or a support. In this case, retaining element 110 should cover an edge of the narrower section (opening) of the keyhole-shaped cutout, so that support of retaining element 110 on the wall as well as contacting (a bolt, for example) through retaining element 110 and into the narrower section of the key-shaped cutout in the wall is possible. The fastening device also includes a locking element 120 which, for example, is a clip-in pin having a locking tab made of a flexible material. Example embodiments of the present invention are substantially based on locking of fastening device 100 in the "keyhole" during pre-assembly (i.e., insertion of the fastening device into the keyhole).

A protective element 130 which encloses locking element 120 in a U shape is also provided in the exemplary embodiment of the present invention illustrated in FIG. 1. Protective element 130 may have a width which corresponds to the width of the wider opening of the keyhole. It may thus be ensured that, on the one hand, protective element 130 prevents damage or breakage of locking element 120 before fastening device 100 is installed, and, on the other hand, lateral twisting of fastening device 100 during fastening is prevented at the same time. Protective element 130 may be designed such that the maximum deflection or spring excursion of locking element 120 is limited, so that damage or breakage of locking element 120 during assembly is not possible. A sensor 140 for measuring an acceleration, for example, may be mounted on fastening device 200, so that high-precision alignment of the sensor before fastening to a body wall of a vehicle, for example, is possible as the result of the protection against twisting which is provided by example embodiments of the present invention. In this manner the alignment is not able to shift, even during mounting of the sensor (using a screwing device, for example).

According to example embodiments of the present invention, however, at least one support element 150 is provided which during fastening of the fastening device in the wall or a support offers the option of supporting the fastening device against a lateral edge of the wider opening of the keyhole-shaped cutout. In the exemplary embodiment illustrated in FIG. 1, two such support elements 150 are illustrated, which are introduced during insertion of the fastening device into the keyhole-shaped cutout. As a result of skillful selection of the height of support element 150 or the distance of the nut from the housing, after insertion into the keyhole, fastening device 100 is not allowed to twist about the axis of screw connection 210, even after it has fallen out of the keyhole (before the locking of locking element 120), since the ends of the support elements project into the lateral wall of the keyhole. Also after locking of locking device 120, in the final assembly lateral supports 150 provide anti-twist protection of fastening device 100 in both rotational directions. The support elements have an angular design, the partial section of each of support elements 150 being provided perpendicularly to an edge at which the fastening device is to be supported at the side edge of the wider opening. This perpendicular partial section is situated at the end of the portion which rests against the supporting edge in the fastened state which is the farthest distance from the narrower opening. The greatest possible hold of the support element, (which is usually made of plastic), is ensured, since due to the lever action the bending forces at a point about the rotational axis which is situated the farthest distance away may be easily absorbed. For this reason, support by the portion which is perpendicular to the supporting edge is most advantageous when this perpendicular portion is situated the farthest distance away from a possible rotational axis which is to be provided in the region of the narrower opening.

The advantage of example embodiments of the present invention lies in an efficient, cost-effective, and easily implemented anti-twist protection, and in the partial prevention of tilting outward after the fastening device is inserted into the keyhole. Incorrect assembly due to twisting of the component after the pre-assembly and before the final screwing is thus effectively prevented.

To provide manufacturing of fastening device 100 in the most simple and cost-effective manner possible, retaining element 110, locking element 120, protective element 130, and support elements 150 may be manufactured in one piece from a flexible plastic material. This merely requires a simple and inexpensive adaptation of an injection mold in order to make use of the advantages of example embodiments of the present invention. The additional consumption of plastic material which is required is negligible.

Figure 2:
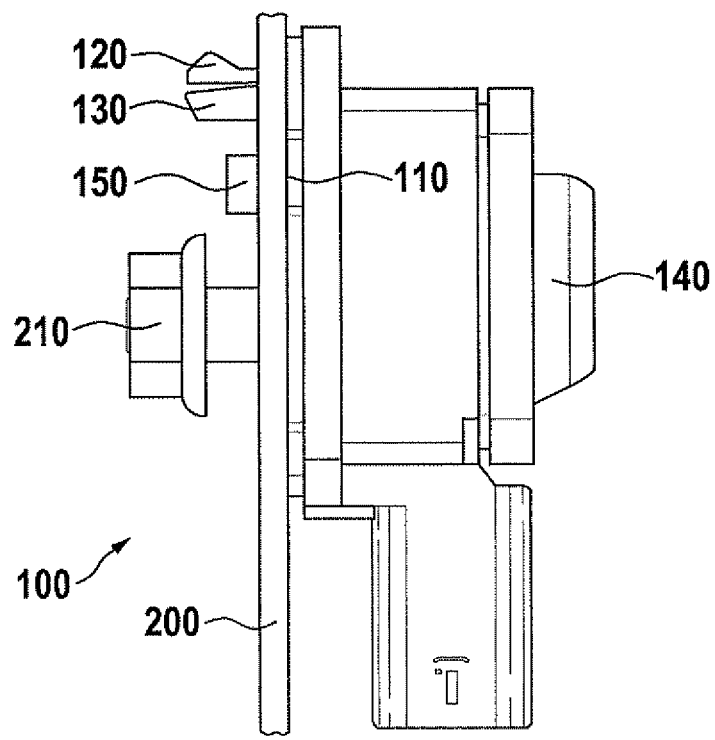
FIG. 2 shows a side view of the exemplary embodiment of the present invention, in the fastened state.

FIG. 2 shows the exemplary embodiment of the present invention illustrated in FIG. 1 in the installed state on a wall 200, in a sectional illustration. Screw connection 210 is also illustrated, which cooperates with retaining element 110 and fastens fastening device 100 to the wall 200 in the region of the narrower section of the keyhole.

Figure 5:
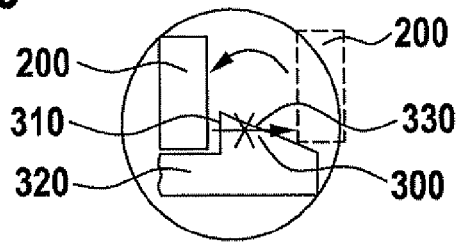
FIG. 5 shows an illustration of a detail of the side view from FIG. 4, in which the locking characteristics of the locking element before and after locking are illustrated.

FIG. 3 illustrates an example embodiment in greater detail, in which in particular a locking element 120 having a plastic protective anchor 130 is shown. Efficient fastening of fastening device 100 may be ensured in this manner by preventing fastening device 100 from falling out before screwing down. FIG. 4 shows the fastening of such a fastening device to a wall. The active principle according to the exemplary embodiment illustrated in FIGS. 3 and 4 is shown in greater detail in FIG. 5, which illustrates a detail of the sectional illustration from FIG. 2 (wall 200 being illustrated in dashed lines) and after locking element 120 locks in wall 200. The flexible clip-in pin (i.e., locking element 120) may be deflected in the direction of the screw-in bolt of screw connection 210 as the result of contact with wall 200 when fastening device 100 is pressed in, so that locking tab 300, which rises flatly in the direction of the "housing," may be pressed at the end of the pin through screw-on plate 200. The angle between side 310 of locking tab 300 facing the sensor and a connecting web 320 is much steeper (ideally, 90°) than the angle defined by side 330 of locking tab 300 facing away from the sensor and connecting web 320, so that locking occurs as soon as the highest point of locking tab 300 passes through screw-on plate 200 (i.e., the pin or the locking element springs back). As a result, the reverse path of locking element 120 out of the keyhole is ideally no longer possible. For applications requiring simple, nondestructible disassembly of fastening device 200, the locking tab may also be provided with a less steep side 310 (no right angle). In this case the locking characteristic is not ideal, but it is possible to pull locking tab 300 again out of the keyhole. A plastic anchor 130 is formed around the pin as (further) anti-twist protection, and also for protection of pin 120. Plastic anchor 130 is able to protect pin 120 from falling down or possible damage. For this purpose, plastic anchor 130 should be longer than pin 120 (same height), so that clip-in pin 120 remains unaffected when sensor 140 falls down.

According to the example embodiment of FIGS. 1 through 3, catch hook 120 ideally prevents anchor 130 from falling out of the keyhole. Anchor 130 also prevents sensor 140 (or a fastening device 100 mounted on sensor 140) from twisting, for example with respect to a door beam of a vehicle body. However, if the retaining connection between locking element 120 and wall 200 is sufficiently strong, it is also possible to prevent twisting of fastening device 100 with respect to the wall about an axis of screw connection 210.

Figure 6:
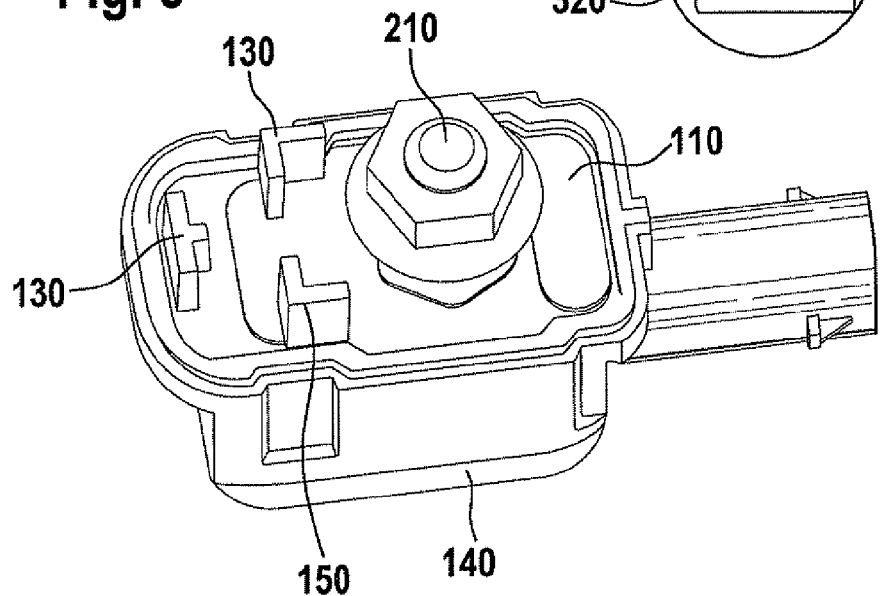
FIG. 6 shows a perspective illustration of an exemplary embodiment of the present invention.

FIG. 6 shows a perspective illustration of an exemplary embodiment of the present invention. Compared to the exemplary embodiment shown in FIGS. 1 and 2, locking element 120 has been dispensed with. An aspect of example embodiments of the present invention lie substantially in providing at least one support element 150 which allows fastening device 100 to be laterally supported against the lateral wall of the wider opening of the keyhole-shaped cutout during fastening of the fastening device. Plastic anchor 130 is not usable as protection for a locking element, but, rather, is used as a guide for inserting the fastening device into the keyhole-shaped cutout.

When example embodiments of the present invention are used, the anti-twist protection is also provided when component 140 partially tilts out of the keyhole after pre-assembly. By extension, the component may also be prevented from partially tilting out of the keyhole before final assembly. Without using the arrangements described herein, after partially tilting out of the keyhole the component may rotate about the bolt axis (of a screw connection 210) and then be improperly screwed on.

Figure 7:
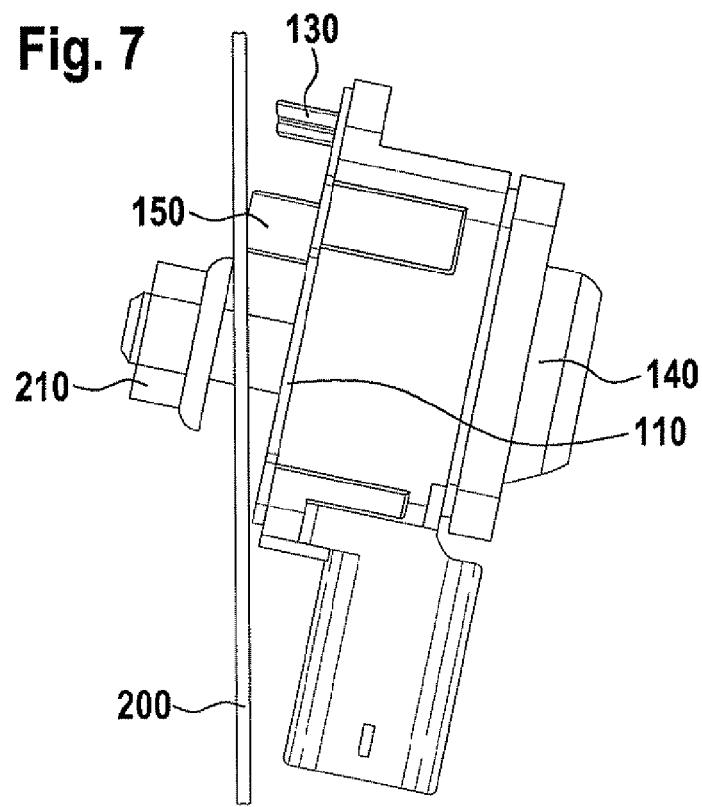
FIG. 7 shows a side illustration of the exemplary embodiment of the present invention, during fastening.

Example embodiments of the present invention are thus substantially based on lateral mountings 150 which prevent twisting directly after the component is suspended into the keyhole. The extension makes use of locking of the component in the keyhole during the pre-assembly (insertion of the component mounting into the keyhole). For locking, a clip-in pin, for example, may be used which is composed of a flexible pin having a locking tab. The lock may also be used without the lateral mountings. In this case, anti-twist protection is not provided only when the component is not locked and then partially tilts out of the keyhole (FIGS. 3 and 4). Likewise, example embodiments of the present invention may be used without the locking device (clip-in pin, for example) when protection against partially tilting outward is not required (FIGS. 6 and 7). In this case only the anti-twist protection acts (as illustrated in FIG. 7). The combination of anti-twist protection (lateral support elements 150) and protection from tilting outward (locking device 120) is illustrated in FIGS. 1 and 2.

An advantage of example embodiments of the present invention is that the component is prevented from twisting after the component mounting is inserted into the keyhole. When the locking device is used, it is also no longer possible for the component to partially tilt out of the keyhole.

In principle, example embodiments of the present invention may be used for all components which use the keyhole-screw concept.

Use of the described approach is currently the only known option for ensuring anti-twist protection when using the hole pattern established by AK-LV29 (standard specification).

Figure 8:
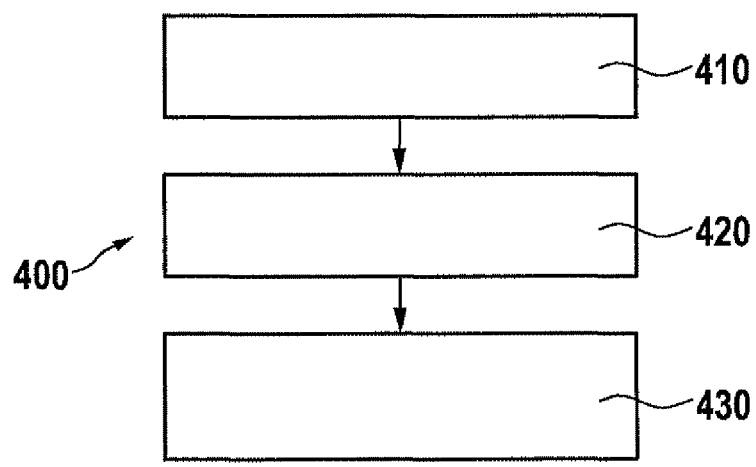
FIG. 8 shows a flow chart of an exemplary embodiment of the present invention as a method.

FIG. 8 illustrates exemplary embodiment of the present invention as a method 400 for fastening a fastening device to a wall which includes a keyhole-shaped cutout. The fastening device has a retaining element and a locking element, the keyhole-shaped cutout being formed by a wider opening in the wall and a narrower opening in the wall which is connected to the wider opening. The method includes a first step of inserting 410 the locking element of the fastening device through the wider opening of the keyhole-shaped cutout in the wall, the retaining element at least partially covering an edge of the narrower opening of the keyhole-shaped cutout. Method 400 also includes a second step of locking 420 the locking element on the back side of the wall in the region of the wider opening of the keyhole-shaped cutout, and a third step of pressing 430 the retaining element against the wall.

Figure 9:
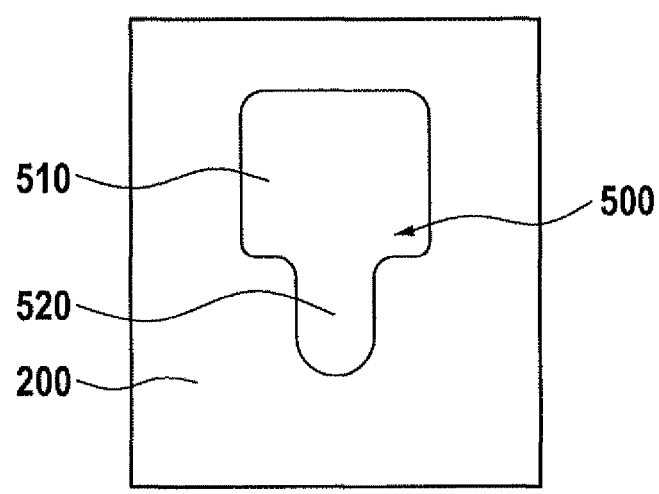
FIG. 9 shows an illustration of one possible shape of the keyhole-shaped cutout in the wall or the support.

FIG. 9 shows an illustration of one shape of a keyhole-shaped cutout 500 in wall 200 or a support. Wider opening 510 and narrower opening 520 are apparent, narrower opening 520 being substantially covered by screwing device 210. Wider opening 510 may have an angular shape or straight side edges to ensure a good hold of support element 150 in keyhole-shaped cutout 500. In the installed state, support element 150 is introduced into wider opening 510 in order to retain fastening device 100.

What is claimed is:

1. A fastening device for fastening an element in a keyhole-shaped cutout in a wall, comprising:
a retaining device having a top surface adapted to rest against a front side of the wall and;
a connecting device protruding above the top surface of the retaining device, the connecting device being adapted to at least partially cover an edge of a narrower opening of the keyhole-shaped cutout in the wall in a fastened state and to engage through the narrower opening of the keyhole-shaped cutout in the wall in the fastened state of the fastening device, in order to fasten the fastening device to the wall at the narrower opening of the keyhole-shaped cutout in the wall; and
at least two support devices protruding above the top surface of the retaining device at respective two oppositely situated ends of the top surface of the retaining device, the at least two support devices are integrated into the top surface of the retaining device and are adapted to engage through a wider opening of the keyhole-shaped cutout in the wall in the fastened state of the fastening device and to support the fastening device against respective two oppositely situated lateral edges of the wider opening during fastening,
wherein the two support devices each have an angular shape,
wherein a partial section of each of the angular support devices in the fastened state projects substantially at a right angle from an edge of the wider opening into an inner region of the wider opening, the partial section being situated at the side of the support device facing away from the narrower opening.

2. The fastening device according to claim 1, wherein the two support devices each have a straight supporting edge adapted for support on the lateral edge of the wider opening.

3. The fastening device according to claim 1, wherein the two support devices each have a supporting edge, the supporting edges being situated at a mutual distance which corresponds to a width of the wider opening of the keyhole-shaped cutout in the wall.

4. The fastening device according to claim 1, further comprising a locking device, in the fastened state of the fastening device, being adapted to engage through a wider opening of the keyhole-shaped cutout in the wall and to retain the fastening device from a back side of the wall.

5. The fastening device according to claim 4, wherein the locking device includes a hook made of a flexible material.

6. The fastening device according to claim 4, wherein the locking device is at least partially enclosed by a protective element.

7. A sensor element, comprising:
a fastening device as recited in claim 1.

8. A method for fastening a fastening device to a wall which includes a keyhole-shaped cutout, the fastening device including a retaining device having a top surface and at least two support devices that are integrated into the top surface of the retaining device and are protruding above the top surface of the retaining device at respective two oppositely situated ends of the top surface of the retaining device, the keyhole-shaped cutout being formed by a wider opening in the wall and a narrower opening in the wall which is connected to the wider opening, the fastening device further including a connecting device protruding above the top surface of the retaining device, the method comprising:
inserting the at least two support devices of the fastening device through the wider opening of the keyhole-shaped cutout in the wall in a fastened state;
engaging the connecting device through the narrower opening of the keyhole-shaped cutout in the wall in the fastened state of the fastening device, in order to fasten the fastening device to the wall at the narrower opening of the keyhole-shaped cutout in the wall, the connecting device at least partially covering an edge of the narrower opening of the keyhole-shaped cutout in the wall;
supporting the fastening device against twisting by pressing the at least two support devices against respective two oppositely situated lateral edges of the wider opening of the keyhole-shaped cutout; and
pressing the retaining device against the wall,
wherein the two support devices each have an angular shape,
wherein a partial section of each of the angular support devices in the fastened state projects substantially at a right angle from an edge of the wider opening into an inner region of the wider opening, the partial section being situated at the side of the support device facing away from the narrower opening.

9. The method according to claim 8, wherein the method is for fastening the fastening device recited in claim 1.

* * * * *